United States Patent
Ji et al.

(10) Patent No.: US 8,593,814 B2
(45) Date of Patent: Nov. 26, 2013

(54) HEAT SINK ASSEMBLY

(75) Inventors: Jin-Biao Ji, Shenzhen (CN); Zhi-Jiang Yao, Shenzhen (CN); Li-Fu Xu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 237 days.

(21) Appl. No.: 13/180,836

(22) Filed: Jul. 12, 2011

(65) Prior Publication Data

US 2012/0188722 A1    Jul. 26, 2012

(30) Foreign Application Priority Data

Jan. 26, 2011    (CN) .......................... 2011 1 0028647

(51) Int. Cl.
*H05K 7/20* (2006.01)
*F28F 7/00* (2006.01)

(52) U.S. Cl.
USPC ...... 361/720; 361/679.54; 361/695; 361/697; 361/704; 361/709; 361/710; 165/80.2; 165/80.3; 165/121; 165/122; 165/104.33

(58) Field of Classification Search
USPC ......... 361/679.46–679.5, 690–697, 688, 689, 361/704–712, 715–724; 165/80.3, 104.33, 165/80.4, 80.5, 121–126, 185; 174/15.1, 174/16.3, 252; D13/179; D23/370, 379, D23/411; 29/832, 836, 837, 838, 890.03, 29/890.035, 890.04; 257/722, 726, 727
See application file for complete search history.

(56) References Cited

U.S. PATENT DOCUMENTS

| | | | | |
|---|---|---|---|---|
| 6,407,919 | B1 * | 6/2002 | Chou | 361/697 |
| D464,939 | S * | 10/2002 | Chuang et al. | D13/179 |
| D476,958 | S * | 7/2003 | Tsai | D13/179 |
| 6,662,412 | B2 * | 12/2003 | Chuang et al. | 24/457 |
| D491,260 | S * | 6/2004 | Luo | D23/411 |
| D500,745 | S * | 1/2005 | Duan et al. | D13/179 |
| 6,913,072 | B2 * | 7/2005 | Luo | 165/104.21 |
| 6,927,979 | B2 * | 8/2005 | Watanabe et al. | 361/697 |
| 7,200,934 | B2 * | 4/2007 | Carter et al. | 29/890.03 |
| 7,289,330 | B2 * | 10/2007 | Lu et al. | 361/710 |
| 7,480,144 | B2 * | 1/2009 | Li | 361/704 |
| 7,493,940 | B2 * | 2/2009 | Chen et al. | 165/121 |
| 7,532,472 | B2 * | 5/2009 | Lin et al. | 361/697 |
| 7,589,967 | B2 * | 9/2009 | Zhou et al. | 361/697 |
| 7,983,043 | B2 * | 7/2011 | Xu et al. | 361/700 |
| 8,191,613 | B2 * | 6/2012 | Yuan et al. | 165/80.3 |
| 8,199,502 | B2 * | 6/2012 | Ji et al. | 361/697 |
| 8,385,071 | B2 * | 2/2013 | Lin | 361/710 |
| 2007/0121293 | A1 * | 5/2007 | Hong et al. | 361/697 |
| 2009/0244844 | A1 * | 10/2009 | Liao et al. | 361/697 |
| 2009/0262505 | A1 * | 10/2009 | Lin | 361/709 |

* cited by examiner

*Primary Examiner* — Michail V Datskovskiy
(74) *Attorney, Agent, or Firm* — Altis Law Group, Inc.

(57) ABSTRACT

A heat sink includes a contact portion, a first support rib, a second support rib, a third support rib and a fourth support rib radially extended from the contact portion, and a plurality of parallel fins radially extended from the first support rib, the second support rib, the third support rib and the fourth support rib between two adjacent support ribs. The contact portion contacts with a first heat source. A distance from the contact portion to an edge of the plurality of parallel fins between the first support rib and the second support rib is a first distance. A distance from the contact portion to an edge of the plurality of parallel fins between the third support rib and the fourth support rib is a second distance. The first distance is less than the second distance.

9 Claims, 3 Drawing Sheets sink assembly on the motherboard. As the first distance is decreased to less than the second distance, the distance from the contact portion 10 to the edge of the plurality of parallel fins 15 between the first support rib 11 and the second support rib 12 is less than the distance between the contact portion 10 and the second heat source 22. Interference between the heat sink assembly and the second heat source 22 is avoided. Furthermore, the third
HEAT SINK ASSEMBLY

BACKGROUND

1. Technical Field

The present disclosure relates to a heat sink assembly for dissipating heat for an electronic component mounted on a printed circuit board.

2. Description of Related Art

There are many components mounted on a printed circuit board, such as a south bridge, a north bridge, and an Integrated circuit (IC). A component, such as a CPU, usually needs a heat sink for heat dissipation. A typical symmetrical heat sink includes a base and a plurality of fins extending from the base. The heat sink is often mounted on the CPU with the base contacting a surface of the CPU. However, there are some components which are mounted on a PCB, such as memories. The typical heat sink tends to cause interference with the memories when fixed on the PCB.

Therefore, there is room for improvement within the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
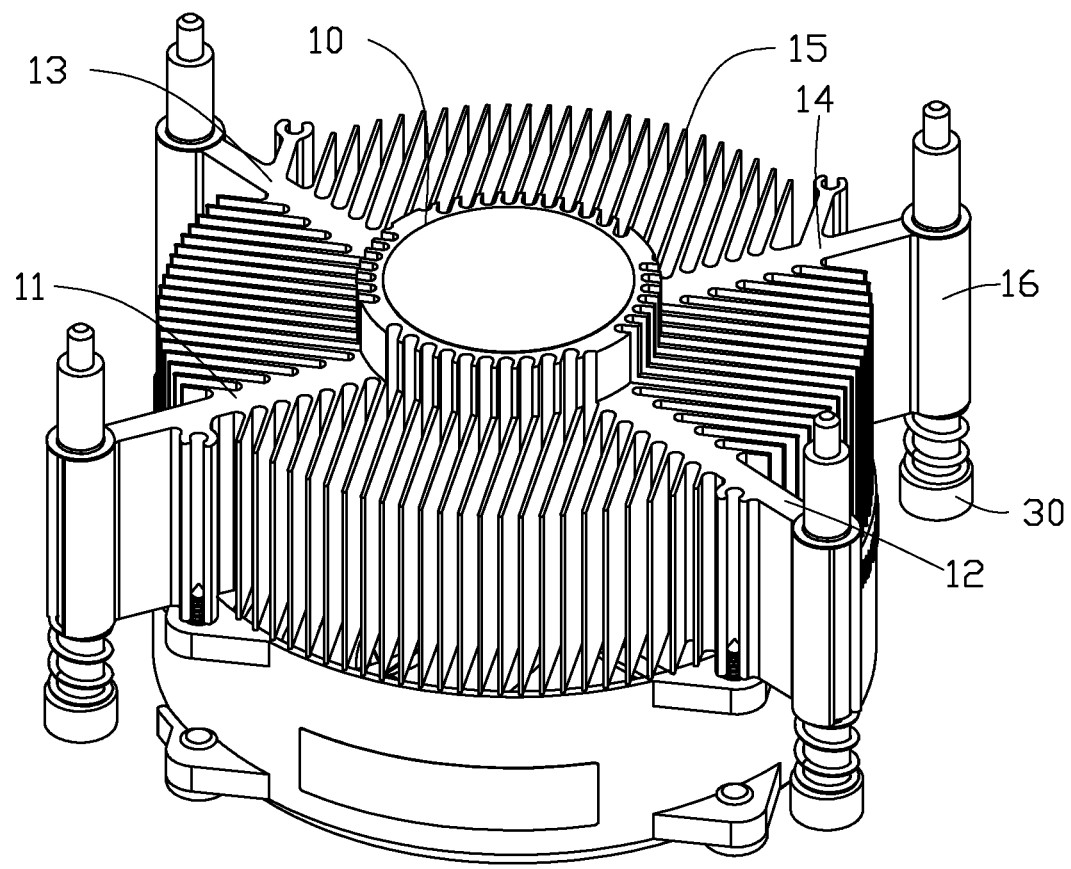
FIG. 1 is an isometric view of an embodiment of a heat sink assembly.

Referring to FIG. 1, a heat sink assembly with an embodiment includes a contact portion 10 for contacting with a heat source, a first support rib 11, a second support rib 12, a third support rib 13, and a fourth support rib 14 radially extended from the contact portion 10. A plurality of parallel fins 15 are radially extended from the first support rib 11, the second support rib 12, the third support rib 13 and the fourth support rib 14 between two adjacent support ribs. The first support rib 11 is adjacent to the second support rib 12. The third support rib 13 is adjacent to the fourth support rib 14. The second support rib 12 is adjacent to the fourth support rib 14. A distance from the contact portion 10 to an edge of the plurality of parallel fins 15 between the first support rib 11 and the second support rib 12 is a first distance. A distance from the contact portion 10 to an edge of the plurality of parallel fins 15 between the third support rib 13 and the fourth support rib 14 is a second distance. A distance from the contact portion 10 to an edge of the plurality of parallel fins 15 between the first support rib 11 and the third support rib 13 is a third distance. A distance from the contact portion 10 to an edge of the plurality of parallel fins 15 between the second support rib 12 and the fourth support rib 14 is a fourth distance. In one embodiment, the first distance is less than the second distance, and the third distance is equal to the fourth distance.

Each of the first support rib 11, the second support rib 12, the third support rib 13 and the fourth support rib 14 defines a support leg 16. A distance between two support legs 16 on the first support rib 11 and the second support rib 12 is a fifth distance. A distance between two support legs 16, on the third support rib 13 and the fourth support rib 14, is equal to the fifth distance. A distance between two support legs 16, on the first support rib 11 and the third support rib 13, is a sixth distance. A distance between two support legs 16, on the second support rib 12 and the fourth support rib 14, is equal to the sixth distance. In one embodiment, the fifth distance is greater than the sixth distance.

Figure 2:
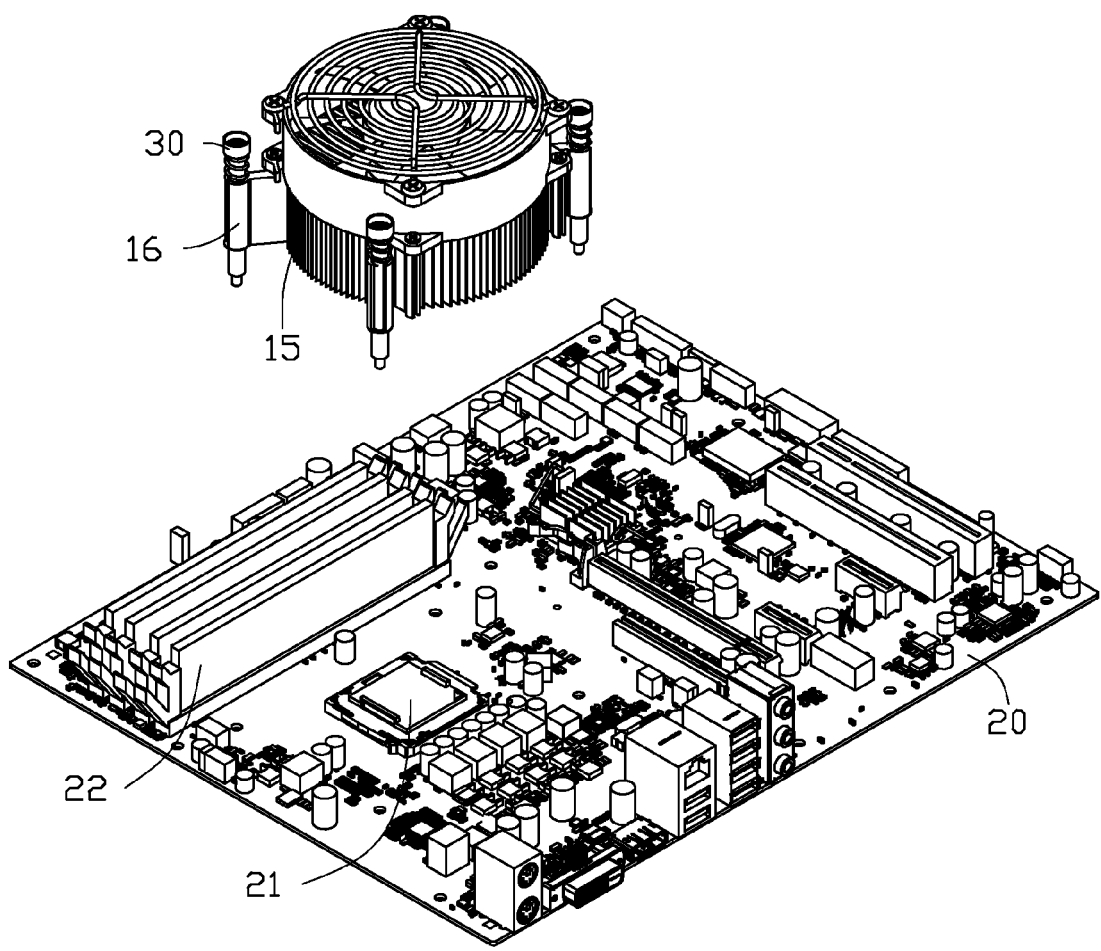
FIG. 2 is an exploded view of an embodiment of the heat sink assembly, together with a PCB.
Figure 3:
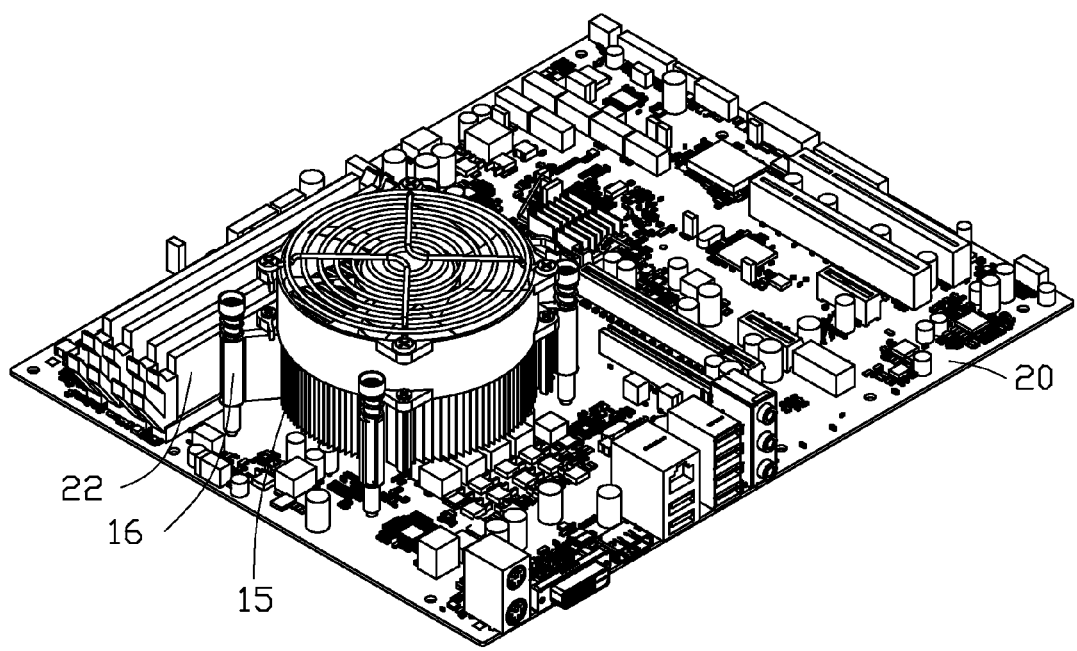
FIG. 3 is an assembled view of FIG. 2.

Referring to FIGS. 2 and 3, the heat sink assembly is fixed on a motherboard 20 with the contact portion 10 contacting with a first heat source 21. The heat generated by the first heat source 21 is transmitted to the plurality of parallel fins 15 via the contact portion 10. A second heat source 22 is positioned on the motherboard 20 adjacent to the first heat source 21. A distance between the contact portion 10 and the second heat source 22 is greater than the first distance. In one embodiment, the first heat source 21 is a CPU, and the second heat source 22 is memory. The contact portion 10 and the plurality of parallel fins 15 have a cylindrical shape. An axis of the contact portion 10 is not superposed with that of the plurality of parallel fins 15.

In assembly, the contact portion 10 contacts with the first heat source 21. A plurality of fastening members 30 passes through the corresponding fixing holes (not shown) on the support legs 16 to fix the heat sink assembly on the motherboard 20. As the first distance is decreased to less than the second distance, the distance from the contact portion 10 to the edge of the plurality of parallel fins 15 between the first support rib 11 and the second support rib 12 is less than the distance between the contact portion 10 and the second heat source 22. Interference between the heat sink assembly and the second heat source 22 is avoided. Furthermore, the third distance is equal to the fourth distance. The plurality of parallel fins 15 between the first support rib 11 and the third support rib 13 is symmetric to that of the second support rib 12 and the fourth support rib 14, with respect to the axes of the contact portion 10 and the plurality of parallel fins 15. Therefore, the heat sink assembly is steadily fixed on the motherboard 20 and will not generate additional pressure on the first heat source 21 when there is force on the heat sink assembly.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A heat sink comprising:
    a contact portion;
    a first support rib, a second support rib, a third support rib and a fourth support rib radially extended from the contact portion; wherein the first support rib is adjacent to the second support rib; and the third support rib is adjacent to the fourth support rib; and
    a plurality of parallel fins extended from the first support rib, the second support rib, the third support rib and the fourth support rib between two adjacent support ribs; wherein a distance from the contact portion to an edge of the plurality of parallel fins between the first support rib and the second support rib is a first distance; a distance from the contact portion to an edge of the plurality of parallel fins between the third support rib and the fourth support rib is a second distance; and the first distance is less than the second distance.

2. The heat sink of claim 1, wherein the second support rib is adjacent to the fourth support rib; a distance from the contact portion to an edge of the plurality of parallel fins between the first support rib and the third support rib is a third distance; a distance from the contact portion to an edge of the plurality of parallel fins between the second support rib and the fourth support rib is a fourth distance; and the third distance is equal to the fourth distance.

3. The heat sink of claim 1, wherein a heat source is adapted to contact with the contact portion; a second heat source is adjacent to the first heat source; and a distance between the contact portion and the second heat source is greater than the first distance.

4. The heat sink of claim 3, where the contact portion and the plurality of parallel fins have a cylindrical shape; and an axis of the contact portion is misaligned with that of the plurality of parallel fins.

5. The heat sink of claim 4, wherein the first support rib defines a first support leg thereon; the second support rib defines a second support leg thereon; the third support rib defines a third support leg thereon; the fourth support rib defines a fourth support leg thereon; a distance between the first support leg and the second support leg is a fifth distance; a distance between the first support leg and the third support leg is a sixth distance; and the fifth distance is greater than the sixth distance.

6. The heat sink of claim 5, wherein a distance between the third support leg and the fourth support leg is equal to the fifth distance; and a distance between the second support leg and the fourth support leg is equal to the sixth distance.

7. A heat sink assembly comprising:
a motherboard having a first heat source and a second heat source positioned thereon;
a contact portion positioned on the first heat source;
a first support rib, a second support rib, a third support rib and a fourth support rib radially extended from the contact portion; wherein the first support rib is adjacent to the second support rib; and the third support rib is adjacent to the fourth support rib; and
a plurality of parallel fins extended from the first support rib, the second support rib, the third support rib and the fourth support rib between two adjacent support ribs; wherein a distance from the contact portion to an edge of the plurality of parallel fins between the first support rib and the second support rib is a first distance; the second heat source is adjacent to an edge of the plurality of parallel fins between the first support rib and the second support rib; and a distance between the contact portion and the second heat source is greater than the first distance; the second support rib is adjacent to the fourth support rib; a distance from the contact portion to an edge of the plurality of parallel fins between the third support rib and the fourth support rib is a second distance; and the first distance is less than the second distance.

8. The heat sink assembly of claim 7, wherein a distance from the contact portion to an edge of the plurality of parallel fins between the first support rib and the third support rib is a third distance; a distance from the contact portion to an edge of the plurality of parallel fins between the second support rib and the fourth support rib is a fourth distance; and the third distance is equal to the fourth distance.

9. The heat sink assembly of claim 8, wherein the first support rib defines a first support leg thereon, the second support rib defines a second support leg thereon, the third support rib defines a third support leg thereon; the fourth support rib defines a fourth support leg thereon; a distance between the first support leg and the second support leg is a fifth distance; a distance between the first support leg and the third support leg is a sixth distance; and the fifth distance is greater than the sixth distance.

* * * * *